US009088207B2

(12) United States Patent
Cassel et al.

(10) Patent No.: US 9,088,207 B2
(45) Date of Patent: Jul. 21, 2015

(54) LONG PULSE DROOP COMPENSATOR

(75) Inventors: Richard L. Cassel, Palo Alto, CA (US); Christopher A. Yeckel, Sunnyvale, CA (US)

(73) Assignee: STANGENES INDUSTRIES, INC., Palo Alto, CA (US)

( * ) Notice: Subject to any disclaimer, the term of this patent is extended or adjusted under 35 U.S.C. 154(b) by 34 days.

(21) Appl. No.: 13/559,425

(22) Filed: Jul. 26, 2012

(65) Prior Publication Data

US 2013/0320953 A1    Dec. 5, 2013

Related U.S. Application Data

(60) Provisional application No. 61/655,063, filed on Jun. 4, 2012.

(51) Int. Cl.
*H03K 3/00* (2006.01)
*H03K 3/64* (2006.01)
*H02M 3/155* (2006.01)
*H03K 3/57* (2006.01)

(52) U.S. Cl.
CPC *H02M 3/155* (2013.01); *H03K 3/57* (2013.01)

(58) Field of Classification Search
CPC .............. H03K 3/00; H02M 3/18; G05F 3/02
USPC ........................................................ 307/108
See application file for complete search history.

(56) References Cited

U.S. PATENT DOCUMENTS

| 6,296,742 | B1 * | 10/2001 | Kouznetsov | ............. | 204/192.12 |
| 6,680,603 | B1 | 1/2004 | Klaus-Manfred | | |
| 7,301,250 | B2 * | 11/2007 | Cassel | .......................... | 307/106 |
| RE40,072 | E * | 2/2008 | Prager et al. | ................... | 323/222 |
| 7,432,614 | B2 * | 10/2008 | Ma et al. | ........................ | 307/31 |
| 7,550,876 | B2 | 6/2009 | Cassel | | |
| 7,554,221 | B2 | 6/2009 | Cassel | | |
| 8,036,340 | B2 * | 10/2011 | Soto Santos | ................... | 378/109 |
| 2005/0128655 | A1 | 6/2005 | Cuevas et al. | | |
| 2007/0139090 | A1 | 6/2007 | Cassel | | |
| 2008/0191663 | A1 * | 8/2008 | Fowler et al. | ................. | 320/118 |

(Continued)

FOREIGN PATENT DOCUMENTS

JP          08148977 A        6/1996

OTHER PUBLICATIONS

Dongsheng Ma, Wing-Hung Ki, Chi-Ying Tsui. APseudo-CCM/DMC SIMO Switching Converter With Freewheel Switching. IEEE Journal of Solid-State Circuits, vol. 38, No. 6, Jun. 2003.*

(Continued)

*Primary Examiner* — Rexford Barnie
*Assistant Examiner* — Toan Vu
(74) *Attorney, Agent, or Firm* — Maschoff Brennan

(57) ABSTRACT

One example embodiment may include a power supply system. The power supply system may include a main capacitor and a boost converter. The main capacitor is used to generate an electrical pulse. The boost converter is configured to be coupled to the main capacitor. Additionally, the boost converter includes a compensator supply including an energy storage capacitor that can store electrical energy. The boost converter also includes and a compensator inductor that receives the electrical energy from the compensator supply and is configured to supply electrical energy to the main capacitor when the main capacitor is generating the electrical pulse.

22 Claims, 12 Drawing Sheets

(56) References Cited

U.S. PATENT DOCUMENTS

2009/0316438 A1* 12/2009 Crewson et al. ............... 363/16
2013/0249520 A1* 9/2013 Oikarinen et al. ............ 323/285

OTHER PUBLICATIONS

M.A. Kemp et al., "Design of the Second-Generation ILC Marx Modulator" mkemp@slac.stanford.edu, p. 1-3, Sep. 14, 2010.

P. Chen et al., "Preliminary Experiment on Voltage Droop Compensation for High Power Marx Modulators" Proceedings of 2011 Particle Accelerator Conference, New York, NY, USA, pp. 1076-1078, Oct. 5, 2011.

International Search Report dated Aug. 27, 2013 in application No. PCT/US2013/043934.

* cited by examiner

LONG PULSE DROOP COMPENSATOR

RELATED APPLICATION

This application claims the benefit of U.S. Provisional Application No. 61/655,063, filed Jun. 4, 2012, which is incorporated herein by reference.

BACKGROUND

1. Field of the Invention

Some embodiments described herein generally relate to providing electrical energy to a pulse generator.

2. Related Technology

A pulse generator is a device that may be used to generate a pulse of electrical energy that may be delivered or applied to a pulse load. Pulses may be short bursts of energy. Pulse generators may generate the pulse by charging and then discharging a capacitor. The capacitor may discharge to generate the pulse that is supplied to a pulse load.

Some pulses may be modeled as a square wave with a sharp rise time, a constant voltage, then a sharp fall time. In some circumstances, a square pulse may be difficult to achieve do to ringing, and stray capacitance, for instance. Typically, shorter square pulses may be easier to implement than longer square pulses. For example, for longer square pulses, a conventional pulse generator may be unable to supply a constant voltage throughout the duration of the pulse. This drop in voltage during a pulse, in some instances, may be referred to as droop. To compensate, pulse generators may include excessively large capacitors. However, the large capacitors may introduce additional costs and safety issues.

The subject matter claimed herein is not limited to embodiments that solve any disadvantages or that operate only in environments such as those described above. Rather, this background is only provided to illustrate one example technology area where some embodiments described herein may be practiced.

SUMMARY OF SOME EXAMPLE EMBODIMENTS

Some embodiments described herein generally relate to providing electrical energy to a pulse generator. More particularly, example embodiments relate to long pulse droop compensators.

One example embodiment may include power supply system. The power supply system may include a main capacitor and a boost converter. The main capacitor is used to generate an electrical pulse. The boost converter is configured to be coupled to the main capacitor. Additionally, the boost converter includes a compensator supply including an energy storage capacitor that can store electrical energy and supply electrical energy to the main capacitor. The boost converter also includes and a compensator inductor that receives the electrical energy from the compensator supply and is configured to supply electrical energy to the main capacitor when the main capacitor is generating the electrical pulse.

Another embodiment may include a droop compensator. The droop compensator includes a boost converter and a pulse generator connector. The boost converter may include a compensator inductor, a compensator supply, and an inductor-charging switch that can control the charging of the compensator inductor and the supply of electrical energy to a main capacitor of a pulse generator. The pulse generator connector may be configured to allow the boost converter to be electrically coupled with the main capacitor of the pulse generator.

Another embodiment includes a method of droop compensation for voltage pulse generators. The method includes charging a main capacitor of a pulse generator and a compensator supply of a droop compensator. The compensator supply includes an energy storage capacitor. The method also includes discharging the main capacitor to supply a pulse to a pulse load. While the pulse is supplied to the pulse load, the energy storage capacitor may be discharged through a compensator inductor. Additionally, the method includes supplying electrical energy to the main capacitor from the compensator inductor and the energy storage capacitor.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description, which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other features of the present invention, some embodiments will be illustrated in the appended drawings. It is appreciated that these drawings depict only some embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Some embodiments described herein generally relate to providing electrical energy to a pulse generator. More particularly, example embodiments relate to long pulse droop compensators. An example embodiment may include power supply system. The power supply system may include a main capacitor and a boost converter. The main capacitor is used to generate an electrical pulse. The boost converter is configured to be coupled to the main capacitor. Additionally, the boost converter includes a compensator supply including an energy storage capacitor that can store electrical energy and supply electrical energy to the main capacitor. The boost converter also includes a compensator inductor that receives the electrical energy from the compensator supply and is configured to supply electrical energy to the main capacitor when the main capacitor is generating the electrical pulse. An inductor-charging switch is included that controls whether electrical energy is supplied to the main capacitor. By providing electrical energy to a pulse generator while a main capacitor is being discharged to supply a pulse, droop of the pulse may be reduced.

Figure 1:
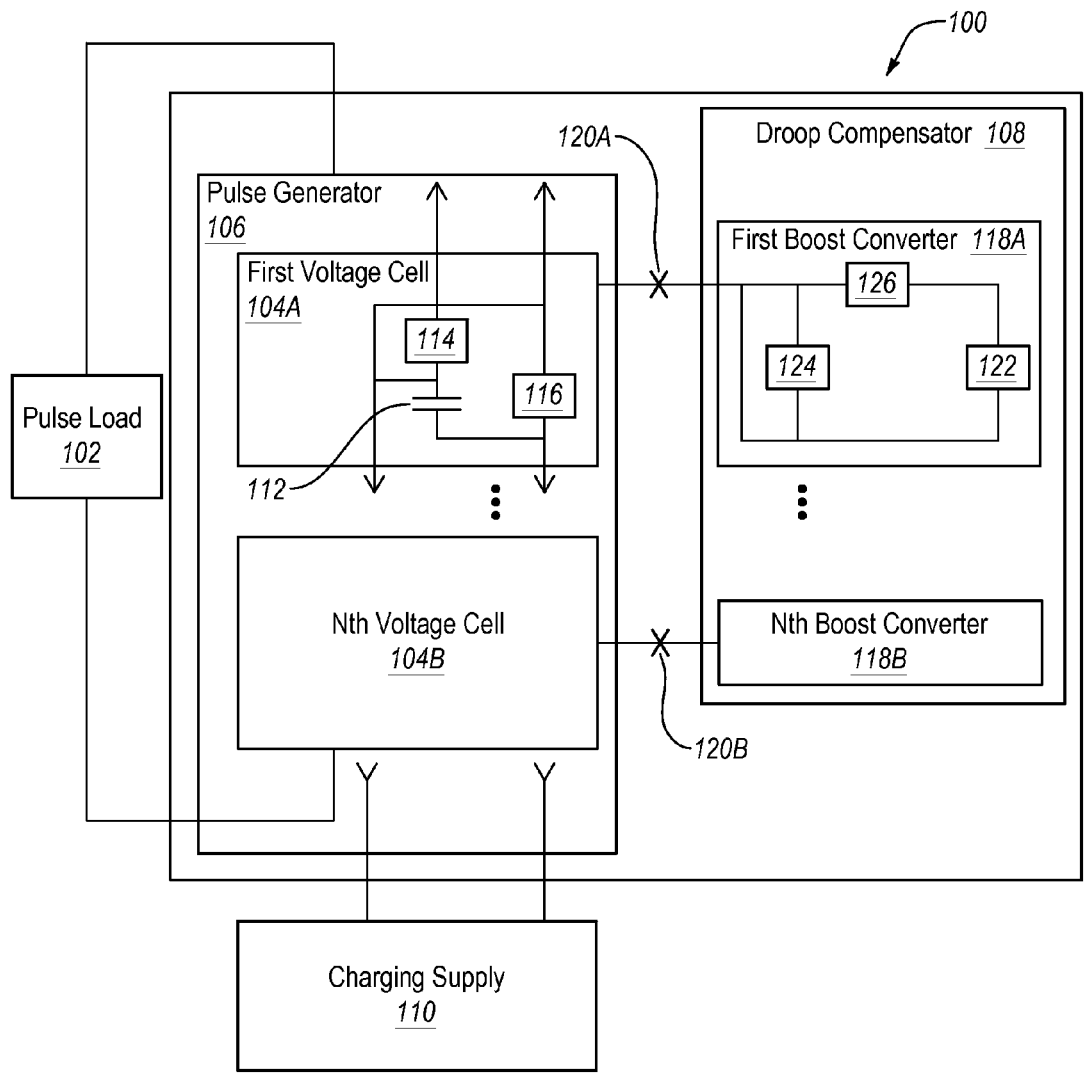
FIG. 1 is an example power supply system that may supply pulses to a pulse load.

FIG. 1 illustrates an example power supply system 100 that may provide long, high-voltage pulses to a pulse load 102. A pulse refers to a short discharge of electrical energy. The power supply system 100 may generate pulses by directing electrical energy from a charging supply 110 to a pulse generator 106 that may supply the electrical energy in the form of a pulse to the pulse load 102.

The power supply system 100 may supply pulses to the pulse load 102. In some embodiments, the pulses may have durations between approximately 100 microseconds and approximately 50 milliseconds, for instance. Pulses of this duration may be referred to as long pulses. During long pulses, the electrical energy supplied to the pulse load 102 may decrease, which may be referred to as droop. The power supply system 100 may compensate at least partially for the droop by transferring energy between components included in the power supply system 100.

In some embodiments, the power supply system 100 may include a pulse generator 106 that may be electrically coupled to the pulse load 102. Additionally, the power supply system 100 may include a droop compensator 108 that may be electrically coupled to the pulse generator 106. In this and other embodiments, the pulse generator 106 may supply the pulse to the pulse load 102 while the droop compensator 108 provides electrical energy to the pulse generator 106. The electrical energy supplied to the pulse generator 106 by the droop compensator 108 may compensate for droop in a pulse.

For example, a pulse load 102 may call for a pulse of 120 kilovolts ("kV") for 1.565 milliseconds ("ms"). However, during the 1.565 ms pulse, the voltage supplied by the power supply system 100 may droop to 110 kV. The power supply system 100 may reduce the droop in the voltage supplied by the power supply system 100 by transferring electrical energy from the droop compensator 108 to the pulse generator 106. By transferring electrical energy, the voltage of the pulse may be maintained at approximately 120 kV. Some example pulse loads 102 might include, but are not limited to, a klystron, a magnetron, a spectrometer, an accelerator, a radar transmitter, a high-impedance electron gun, an ion tube, a liquid polarizing cell, a spark gap, or a thyratron.

The pulse generator 106 may include one or more voltages cells 104. As depicted in FIG. 1, the pulse generator 106 includes a first voltage cell 104A and an nth voltage cell 104B. Inclusion of a component labeled "nth" is meant to depict embodiments including any number of the labeled component. For example, the nth voltage cell 104B is meant to depict that the pulse generator 106 may include any number of voltage cells 104.

The voltage cells 104 may include an electrical energy-storage component that may store electrical energy. The electrical energy-storage component may supply the electrical energy to the pulse load 102. Additionally or alternatively, the voltage cell 104 may include one or more switches that control the electrical energy-storage component. Example switches may control the storage of electrical energy in the electrical energy-storage component and may control the supply of the electrical energy to the pulse load 102.

Specifically, in some embodiments, the electrical energy storage component in the voltage cells 104 may include a main capacitor 112. Electrical energy stored in the main capacitor 112 may be supplied to the pulse load 102. Additionally, the voltage cells 104 may be electrically coupled in such a manner so that the main capacitor 112 of each voltage cell 104 is connected in parallel when being charged by the charging supply 110 and the main capacitor 112 of each voltage cell 104 is connected in series with the pulse load 102 when supplying a pulse to the pulse load 102. Additionally or alternatively, to control the transition from the main capacitor 112 of each voltage cell 104 being connected in parallel to being connected in series, a voltage cell 104 may include a main switch 114 or a main return switch 116.

Functionally, in this and other embodiments, when the voltage cells 104 are electrically coupled to the charging supply 110, the main switch 114 may be in the open position and the main return switch 116 may in the closed position. In this configuration, the charging supply 110 may charge all the voltage cells 104 in parallel. When the voltage cells 104 are charged, the charging supply 110 may be decoupled from the pulse generator 106. The main switch 114 may then close, while the main return switch 116 opens. In this configuration, the voltage cells 104 may supply a pulse to the pulse load 102 in series.

In FIG. 1, only the first voltage cell 104A includes the main capacitor 112, the main switch 114, and the main return switch 116. However, this depiction is not meant to be limiting. In some embodiments, each of the voltage cells 104 may include the main capacitor 112, the main switch 114, and the main return switch 116 or some subset thereof.

Additionally, as used herein, switches that are "open" or "off" refers to a state in which communication and conductivity stops across the switch. Similarly, switches that are "closed" or "on" refer to a state in which communication and conductivity is allowed across the switch.

The pulse generator 106 described above generally describes the principles of a Marx Generator. Some additionally details of a pulse generator 106 that may include main capacitors 112, main switches 114, and main return switches 116 are described in U.S. Pat. Nos. 7,301,250; 7,550,876; and 7,554,221. The disclosures of these patents are incorporated herein by reference in their entirety.

The voltage cells 104 may be configured to be releasably coupled to boost converters 118 included in the droop compensator 108 by way of a releasable coupling 120. The releasable coupling 120 may include one or more electrical plugs or connectors that may allow temporary, periodic, optional, or permanent coupling between the voltage cell 104 and the boost converter 118. For example, the droop compensator 108 may be constructed separately from the voltage cell 104 or be subsequently coupled with the voltage cell 104 for one or more pulses. The droop compensator 108 may then be decoupled from the voltage cell 104 for one or more subsequent pulses.

In some embodiments, each voltage cell 104 may be configured to be releasably coupled to a specific boost converter 118. That is, the first voltage cell 104A may be releasably coupled to a first boost converter 118A via first releasable coupling 120A. Additionally, the nth voltage cell 104B may be releasably coupled to an nth boost converter 118B via the nth releasable coupling 120B. Inclusion of the nth boost converter 118B and the nth releasable coupling 120B are meant to depict that the droop compensator 108 may include any number of boost converters 118 or the power supply system 100 may include any number of releasable couplings 120.

The releasable couplings 120 may allow communication of signals and electrical energy between the pulse generator 106 and the droop compensator 108. For example, signals and electrical energy communicated on the releasable couplings 120 may include, but is not limited to, transfer of electrical energy between the boost converter 118 and the voltage cells 104, communication of signals between one or more of the voltage cells 104 and one or more boost converters 118, and/or between the charging supply 110 and the pulse generator 106 and/or the droop compensator 108 or components included therein.

The boost converters 118 may provide electrical energy to the voltage cells 104 while the main capacitors 112 are supplying a pulse to the pulse load 102. As discussed above, the voltage and/or current supplied by the main capacitors 112 may droop. By supplying the main capacitors 112 with additional electrical energy, the droop compensator 100 may reduce the droop. For example, the boost converters 118 may maintain the voltage and/or current supplied by the main capacitors 112 above a threshold voltage and/or current.

To this end, each boost converter 108 may include a compensator supply 122 that may store electrical energy and supply electrical energy to the main capacitor 112. For example, the compensator supply 122 may include one or more energy-storage capacitors that may store electrical energy. The electrical energy that may be stored in the compensator supply 122 may be discharged through a compensator inductor 126 and supplied to the main capacitor 112. As the electrical energy flows through the compensator inductor 126, a magnetic field may result. At least some portion of the electrical energy discharged by the compensator supply 122 may be stored in the magnetic field of the compensator inductor 126. The energy stored in the magnetic field of the compensator inductor 126 as well as other electrical energy supplied by the compensator supply 122 may be supplied to the main capacitor 112 of the voltage cell 104 while the main capacitor 112 supplies a pulse to the pulse load 102.

Additionally, the boost converters 118 may include an inductor-charging switch 124 that may operably control, at least partially, the electrical energy entering the compensator inductor 126 and the electrical energy discharged from the compensator supply 122. The inductor-charging switch 124 may additionally control, at least partially, the supply of electrical energy by the droop compensator 108 to the pulse generator 106.

In FIG. 1, the first boost converter 118A includes the compensator supply 122, the compensator inductor 126, and the inductor-charging switch 124. However, this depiction is not meant to be limiting. Each of the boost converters 118 may include the compensator supply 122, the compensator inductor 126, and the inductor-charging switch 124 or some subset thereof.

In some embodiments, the droop compensator 108 may be charged by the charging supply 110. For example, the compensator supply 122 and the main capacitor 112 may be configured to charge in parallel when electrically coupled to the charging supply 110. In this and other configurations, a single charging supply 110 may be used for the charging of the power supply system 100.

Figure 2:
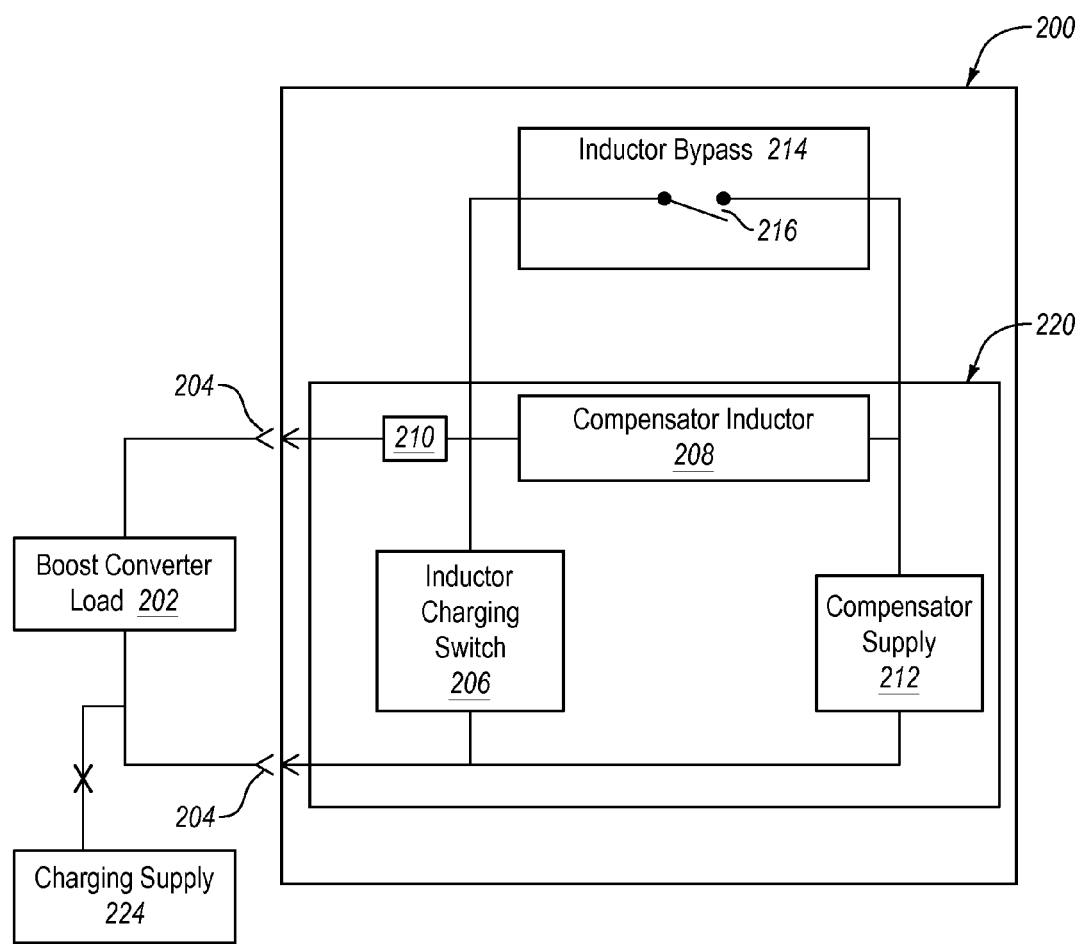
FIG. 2 is an example droop compensator which may be implemented in the power supply system of FIG. 1.

FIG. 2 illustrates an example long pulse droop compensator 200 that may be implemented in the power supply system 100 of FIG. 1. The general function of the droop compensator 200 may be similar to that described with respect to the droop compensator 108 of FIG. 1. Some additional or alternative details are provided with respect to FIG. 2.

The droop compensator 200 may include a boost converter 220. The boost converter 220 may be used to supply an output electrical energy to a boost converter load 202. The physical mechanism underlying the boost converter 220 is a discharge of electrical energy stored in a compensator supply 212 and a compensator inductor 208.

When the compensator supply 212 discharges stored electrical energy through the compensator inductor 208, the compensator inductor 208 may store at least some portion of the electrical energy in a magnetic field. The energy of the magnetic field of the compensator inductor 208 may be supplied as the output electrical energy from the boost converter 220 to the boost converter load 202. In some embodiments, the electrical energy supplied by the compensator inductor 208 may be related to the rate of change of an inductor current during the discharge of electrical energy by the compensator supply 212.

The boost converter 220 may additionally include an inductor-charging switch 206 that may control the electrical energy stored in the compensator inductor 208. The inductor-charging switch 206 may close which may enable the compensation supply 212 to discharge electrical potential through the compensator inductor 208, thereby storing energy in the compensation inductor 208. When the magnetic field of the compensation inductor 208 is produced—referred to herein as "charged," the inductor-charging switch 206 may open. With the inductor-charging switch 206 is open, the compensation inductor 208 and/or the compensator supply 212 may supply electrical energy to a boost converter load 202. The inductor-charging switch 206 may be controlled and/or actuated by a trigger that may be further controlled by a processor and/or an automatic triggering system.

The compensator 200 may include an inductor bypass 214. The inductor bypass 214 may include a leg of boost compensator 200 in parallel to the compensator inductor 208. While the inductor-charging switch 206 is open, the principle of the inductor bypass 214 may include providing a route of low or no resistance such that the energy circulating in the boost converter 220 may not enter and overcharge the boost converter load 202. For example, the electrical potential or some portion thereof discharged by the compensator inductor 208 and the compensator supply 212 may enter the inductor bypass 214 rather than the boost converter load 202 when the electrical resistances of the inductor bypass 214 is near zero. Accordingly, the inductor bypass 214 may include various components that may enable the electrical resistance of the inductor bypass 214 to go to near zero. For example, the inductor bypass 214 may include an inductor bypass switch 216 that may operably control an inductor bypass 214. That is, when the inductor bypass switch 216 is closed, the boost converter load 202 may receive little or no electrical potential discharged from the compensator supply 212 in the boost converter 220.

In contrast, when the inductor bypass switch 216 is open, the electrical resistance on the inductor bypass 214 may be much greater than the electrical resistance of the compensator inductor 208. In this and other configurations, the electrical energy or some portion thereof, discharged from the compensator inductor 208 and/or compensator supply 212 may flow through the boost converter load 202. Like the inductor-charging switch 206, the inductor bypass switch 216 may be controlled and/or actuated by a trigger that may be controlled by a processor and/or an automatic triggering system.

The compensator 200 may include one or more compensator diodes 210. As illustrated in FIG. 2, the one or more compensator diodes 210 may be included in the boost converter 220. In addition to the position shown in FIG. 2, the one or more compensator diodes 210 may be positioned in the inductor bypass 214, the compensator supply 212, the compensator inductor 208, the inductor-charging switch 206, the inductor bypass switch 216, and/or one or more positions there between. Additionally or alternatively, the compensator diodes 210 may be positioned throughout the boost converter load 202. The compensator diodes 210 may be positioned such that the compensation inductor 208 supplies electrical energy and/or the compensation supply 212 discharges electrical potential to the proper components, for instance.

The compensator 200 may be coupled to the boost converter load 202 via a pulse generator connector 204. The boost converter load 202 may be supplied voltage and/or current by the boost converter 220. Generally, the boost converter 220 supplies energy to boost converter load 202 after the compensator inductor 208 has been charged by the compensator supply 212. In this circumstance, the inductor-charging switch 206 is opened and the electrical energy in the compensator inductor 208 flows to the boost converter load 202 via the pulse generator connector 204.

In some embodiments, the boost converter load 202 may include a main capacitor of a voltage cell. For example, the boost converter load 202 may include the main capacitor 112 of the first voltage cell 104A of FIG. 1. Accordingly, the pulse generator connector 204 may allow the first voltage cell 104A of the pulse generator 106 to be electrically coupled with the droop compensator 200 such that the first voltage cell 104A of the pulse generator 106 may be the boost converter load 202. In this and other configurations, the first voltage cell 104A may be supplied voltage and/or current by the droop compensator 200.

Additionally or alternatively, the pulse generator connector 204 may include communication connections that may allow the communication of signals between the boost converter load 202, the boost converter 220, and/or the droop compensator 200. The signals may include triggering signals for the inductor-charging switch 206, the inductor bypass switch 216, a main switch of a pulse generator, and/or a main return switch of a pulse generator, for instance. The signals may additionally or alternatively include measurements from the boost converter load 202 that may include, but are not limited to, a voltage at or current supplied to the boost converter load 202.

Additionally or alternatively, the pulse generator connector 204 may include a charging connection through which electrical energy from a charging supply 224 may charge the compensator supply 212. As illustrated in FIG. 2, the charging supply 224 may be electrically coupled to the boost converter load 202 to charge the boost converter load 202 for example. The electrical energy used to charge the boost converter load 202 may additionally charge the compensator supply 212. Specifically, in some embodiments, the charging supply 224 may charge the boost converter load 202 and the compensator supply 212 in parallel.

Additionally or alternatively, the pulse generator connector 204 may be designed and/or configured such that the droop converter 200 may be releasably and/or selectively attached to the boost converter load 202. That is, the pulse generator connector 204 may include an ability to connect and/or allow the interface between the droop converter 200 with an already-existing boost converter load 202. For example, the pulse generator connector 204 may be specifically designed to connect the droop converter 200 with a typical Marx type solid-state modulator having a specific number of voltage cells.

The pulse generator connector 204 may vary with a particular boost converter load 202 and/or a particular application of the droop compensator 200. Two examples are discussed below illustrating different configurations.

Figure 3:
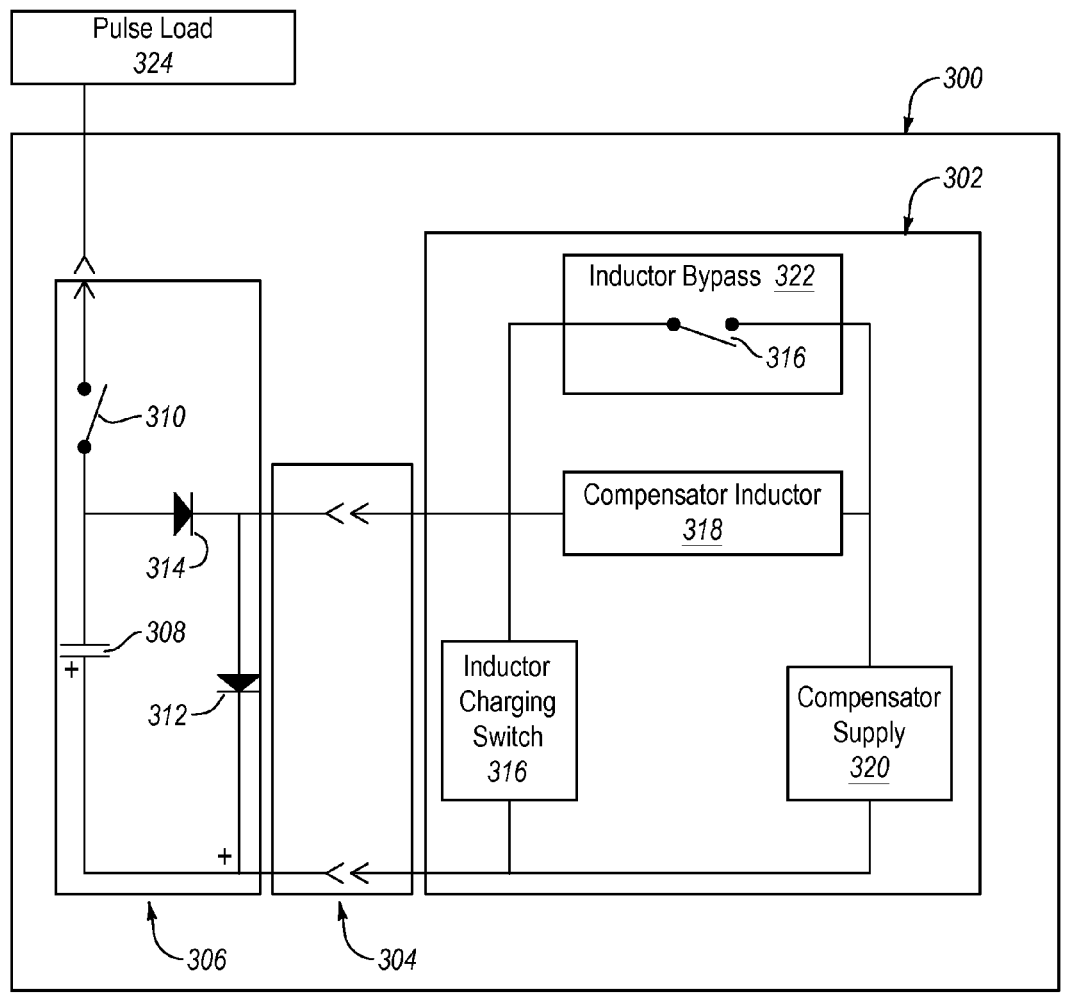
FIG. 3 is an example power supply system in which the boost converter load may include single capacitor modulator.

Referring to FIG. 3, an example power supply system 300 is illustrated in which the boost converter load may include a single capacitor modulator 306 that may supply a pulse load 324 with a pulse having a negative voltage. The single capacitor modulator 306 may be supplied with a voltage and/or current from a droop compensator 302 via a pulse generator connection 304. The droop compensator 302 may include an inductor-charging switch 316, a compensator inductor 318, a compensator supply 320, and an inductor bypass 322. The droop compensator 302 may function similarly to the droop compensator 200 of FIG. 2. The single capacitor modulator 306 may include a main capacitor 308, a main switch 310, and diodes 312 and 314. The main capacitor 308 may supply to the pulse load 324 the pulse with a negative voltage through the main switch 310.

The pulse generator connection 304 may include a connection between the single capacitor modulator 306 and the droop compensator 302. In the power supply system 300, after the compensator inductor 318 is charged by the compensator supply 320, the inductor-charging switch 316 opens. The inductor bypass 322 may be open such that the electrical energy that was stored by the compensator inductor 318 may flow through the compensator supply 320. The electrical energy may flow through the pulse generator connection 304 and be supplied to the positive side of the main capacitor 308 of the single capacitor modulator 306. The electrical energy supplied by the compensator inductor 318 and the compensator supply 320 to the main capacitor 308 may charge the main capacitor 308. The orientation of the diodes 314 and 312 may restrict the flow of the electrical energy supplied by the compensator inductor 318.

Figure 4:
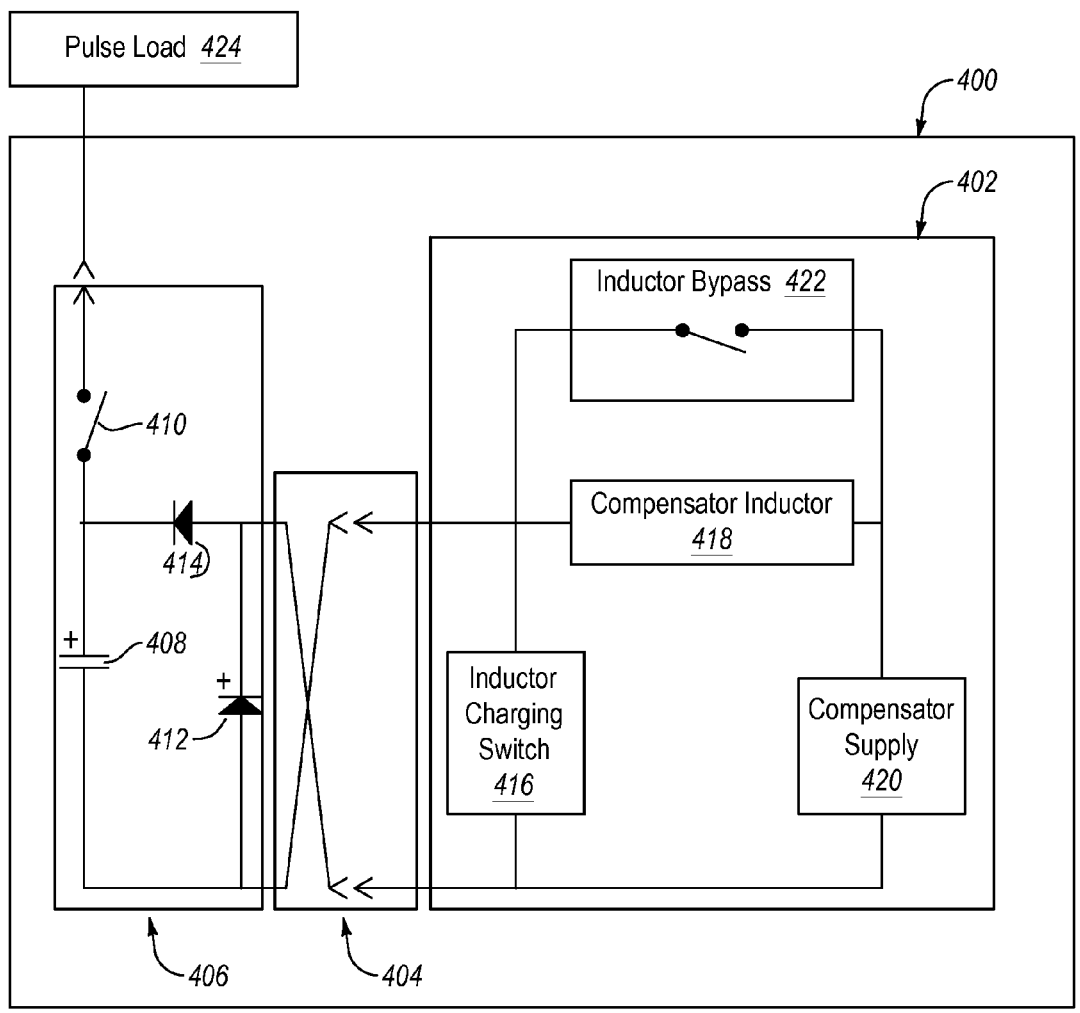
FIG. 4 is an example power supply system in which the boost converter load may include a single capacitor modulator.

Referring to FIG. 4, an example power supply system 400 is illustrated in which the boost converter load may include a single capacitor modulator 406 that may supply a pulse load 424 with a pulse having a positive voltage. The single capacitor modulator 406 may be supplied with a voltage and/or current from a droop compensator 402 via a pulse generator connection 404. The droop compensator 402 may include an inductor-charging switch 416, a compensator inductor 418, a compensator supply 420, and an inductor bypass 422. Operably, the droop compensator 402 may function similarly to the droop compensator 200 if FIG. 2. The single capacitor modulator 406 may include a main capacitor 408, a main switch 410, and one or more diodes 412 and 414. The main capacitor 408 may supply to the pulse load the pulse with a positive voltage through the main switch 410.

The pulse generator connection 404 may include a connection between the single capacitor modulator 406 and the droop compensator 402. In the power supply system 400, after the compensator inductor 418 is charged by the compensator supply 420, the inductor-charging switch 416 opens. The inductor bypass 422 may be open such that the electrical energy that was stored by the compensator inductor 418 may flow through the compensator supply 420. The electrical energy may flow through the pulse generator connection 404 and the diode 414 and be supplied to the positive side of the main capacitor 408 of the single capacitor modulator 406. The electrical energy supplied by the compensator inductor 418 to the main capacitor 408 may charge the main capacitor 408. The orientation of the diode 412 may restrict the flow of the electrical energy supplied by the compensator inductor 418.

Contrasting the pulse generator connections 404 and 304 of FIGS. 4 and 3 respectively, the pulse generator connections 404 and 304 may supply the electrical energy from the compensator inductors 418 and 318 to a different part of the pulse generators 406 and 306. To which component or portion thereof, the electrical energy is supplied may be based on the orientation of the main capacitors 308 and 408 and/or the orientation of the diodes 314, 312, 414, and 412, for example.

Figure 5:
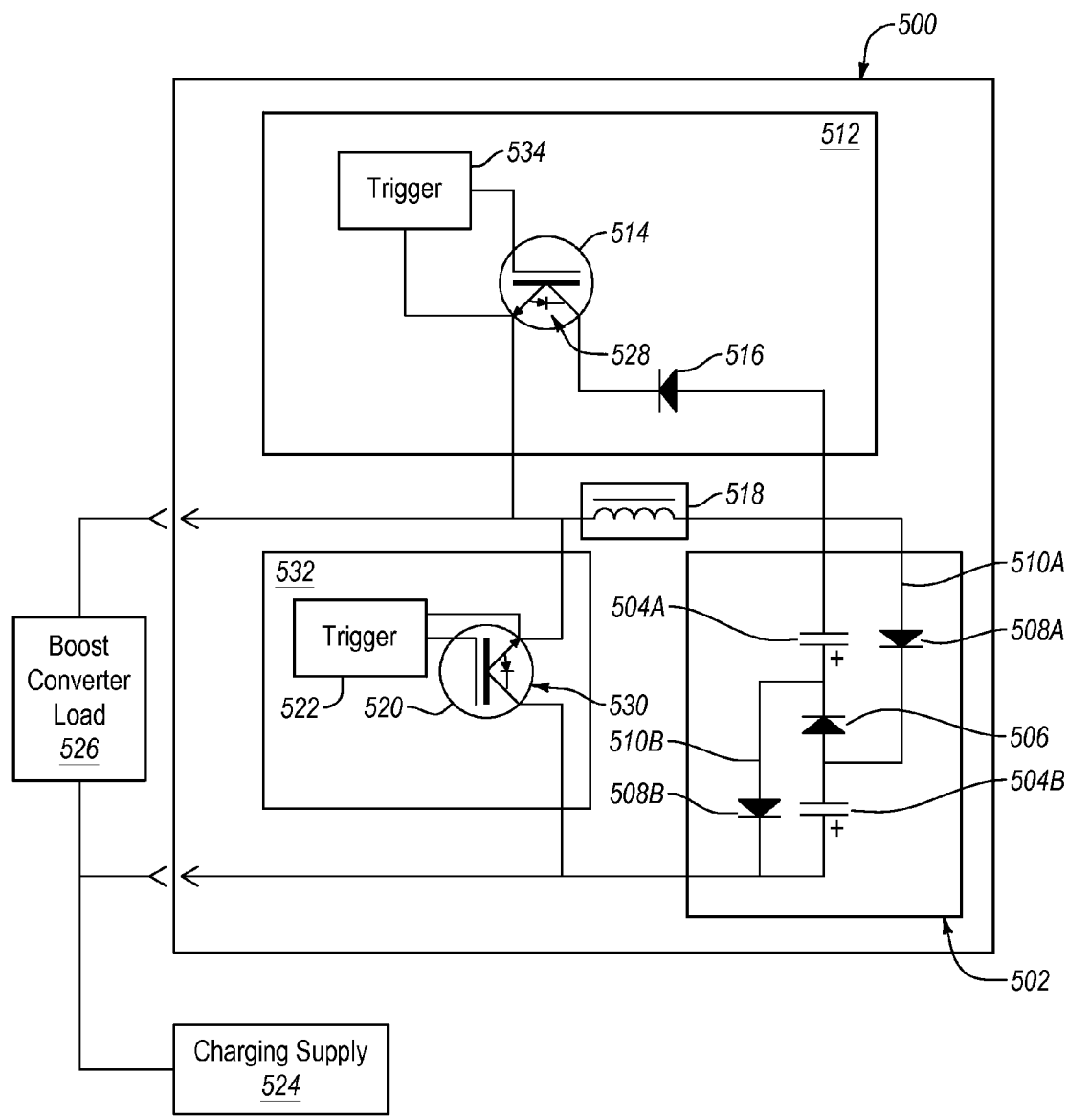
FIG. 5 is an example of a droop compensator that may be implemented in the power supply system of FIG. 1.

FIG. 5 illustrates an example of a droop compensator 500 that may be implemented in the power supply system 100 of FIG. 1. The droop compensator 500 may include a compensator supply 502. The compensator supply 502 may include two energy storage capacitors 504A and 504B with positive and negative terminals. The positive terminal of the two energy storage capacitors is indicated by the "+" in FIGS. 5-6E.

The energy storage capacitors 504A and 504B may be configured in series. When a charging supply 524 is connected to the droop compensator 500, the compensator supply 502 may charge in parallel with a boost converter load 526, and the energy storage capacitors 504A and 504B included in the compensator supply 502 may charge in series.

For example, in embodiments in which the boost converter load 526 is a voltage cell, the compensator supply 502 may charge in parallel with the voltage cell and the two energy storage capacitors 504A and 504B within the compensator supply 502 may charge in series.

The compensator supply 502 may include various diodes that may direct or restrict charging and/or discharging of various components in the droop compensator 500. For example, the compensator supply 502 may include an intra-energy storage capacitor diode 506. The intra-energy storage capacitor diode 506 may be positioned between the negative terminal of one of the two energy storage capacitors 504 and the positive terminal of another of the two energy storage capacitors 504. An example function of the intra-energy storage capacitor diode 506 may include during charging the electrical energy from the charging supply 524 is routed in a single direction through the two energy storage capacitors 504A and 504B.

In some embodiments, the compensator supply 502 may include a peaking switch (not shown) in place of the intra-energy storage capacitor diode 506. The peaking switch may include an insulated gate bi-polar transistor (IGBT), which may act as a diode or a switch. In these and other embodiments, the peaking switch may be used to place the energy storage capacitors 504A and 504B in series. By placing the energy storage capacitors 504A and 504B in series, additional energy may be supplied to the boost converter load 526.

Additionally the compensator supply 502 may include two energy storage bypass diodes 508A and 508B. The energy storage bypass diodes 508A and 508B may be positioned in energy storage capacitor bypass legs 510A and 510B. Specifically, a first storage bypass diodes 508A may be positioned in a first energy storage bypass leg 510A which may be in parallel with one of the two energy storage capacitors 504. Additionally, a second energy storage bypass diode 508B may be positioned in a second energy storage bypass leg 510B which may be in parallel with another of the two energy storage capacitors energy 504. Depending on the flow of electrical energy within the compensator supply 502, the energy storage bypass diodes 508A and 508B may be reverse biased or forward biased with respect to the intra-energy storage capacitor diode 506.

Compensating for the droop of a boost converter load 526 may involve a specific quantity of electrical energy supplied by the droop compensator 500. The droop compensator 500 may draw the specific quantity of electrical energy from the two energy storage capacitors 504A and 504B and the compensator inductor 518. In some embodiments in which the boost converter load 526 includes a main capacitor, each of the two energy storage capacitors 504A and 504B may be of comparable size to the main capacitor. Alternatively, in some embodiments, each of the two energy storage capacitors 504A and 504B may have one-half the capacitance of the main capacitor. In some embodiments, each of energy storage capacitors 504A and 504B may have twice the capacitance of the main capacitor and may be charged to half the voltage of the main capacitor.

As depicted in FIG. 5, the compensator supply 502 may include two energy storage capacitors 504, one intra-energy storage capacitor diode 510, and two energy bypass diodes 508. However, this depiction is not limiting. That is, the compensator supply 502 may include the configuration described herein or any multiple thereof. For example, in some embodiments, the compensator supply 502 may include three energy storage capacitors 504, two intra-energy storage capacitor diode 510, and three energy bypass diodes 508.

The droop compensator 500 may include an inductor bypass 512 that may be configured in parallel to the compensator inductor 518. Because the inductor bypass 512 may be configured in parallel to the compensator inductor 518, an electrical resistance in the inductor bypass 512 may control whether electrical energy flows into the boost converter load 526 or stays in the droop compensator 500.

The inductor bypass 512 may include an inductor bypass switch 514. The inductor bypass switch 514 may include any type of solid-state switch including, but not limited to, a bipolar junction transistors, a field effect transistor, a Darlington bipolar transistor, a MOSFET, or an IGBT. Additionally, as illustrated in FIG. 5, the inductor bypass switch 512 may include a diode 528 that may be positioned between the emitter and the collector of the inductor bypass switch 514.

The inductor bypass 512 may include an inductor bypass switch trigger 534. The inductor bypass switch trigger 534 may communicate signals to the inductor bypass switch 514 that may drive the inductor bypass switch open and close. The inductor bypass switch trigger 534 may open and close the inductor bypass switch 514 in accordance with the function of the droop compensator 500. For example, when the compensator supply 502 is charging, the inductor bypass switch trigger 534 may send a signal to close the inductor bypass switch 514 that may bypass the compensator inductor 518 while the compensator supply 502 and the boost converter load 526 charges.

The inductor bypass 512 may include an inductor bypass diode 516. The inductor bypass diode 516 may direct and limit electrical energy in the inductor bypass 512. Additionally, the inductor bypass diode 516 may be configured in series with the inductor bypass switch 514. That is, when the inductor bypass switch is closed, electrical energy may flow through the inductor bypass diode 516 and the inductor bypass switch 514 thereby preventing the electrical energy in the compensator inductor 518 from entering and/or over charging the boost converter load 526.

In alternative embodiments, the inductor bypass 512 may include some subset of the inductor bypass switch 514, the inductor bypass switch trigger 534, and the inductor bypass diode 516. Additionally or alternatively, the position or arrangement of the inductor bypass switch 514, the inductor bypass switch trigger 534, and the inductor bypass diode 516 may vary.

The droop compensator 500 may include an inductor-charging switch 532 that may include a solid-state switch 520. The solid-state switch may include, but is not limited to, a bipolar junction transistor, a field effect transistor, a Darlington bipolar transistor, a MOSFET, or an IGBT. Additionally, as illustrated in FIG. 5, the inductor-charging switch 532 may include a diode 530 that may be positioned between the emitter and the collector of the inductor-charging switch 520.

The inductor-charging switch 532 may include an inductor-charging switch trigger 522. The inductor-charging switch trigger 522 may communicate signals to the solid-state switch 520 of the inductor-charging switch 532 that may drive the solid-state switch 520 of the inductor-charging switch 532 open and close. The inductor-charging switch trigger 522 may open and close the solid-state switch 520 in accordance with the function of the droop compensator 500. For example, to charge the compensator inductor 518, the inductor-charging switch trigger 522 may send a signal to close the solid-state switch 520 of the inductor-charging switch 532 that may include the compensator inductor 518 in an electrical circuit with the compensator supply 502 while the compensator supply 502 discharges electrical potential. Additionally, the inductor-charging switch 532 controls whether electrical energy stored in the compensator inductor 518 and the compensator supply 502 is supplied to the boost converter load 526. More specifically, when the inductor-charging switch is open electrical energy may be supplied to the boost converter load 526. Alternatively, when the inductor-charging switch is closed no electrical energy is supplied to the boost converter load 526.

The inductor-charging switch trigger 522 may operate the inductor-charging switch 520 or the inductor bypass switch trigger 534 may operate the inductor bypass switch 514 automatically. In some embodiments, the inductor-charging switch trigger 522 or the inductor bypass switch trigger 534 may operate based upon voltages and/or currents measured throughout the droop compensator 500 or the boost converter load 526.

Figure 6A:
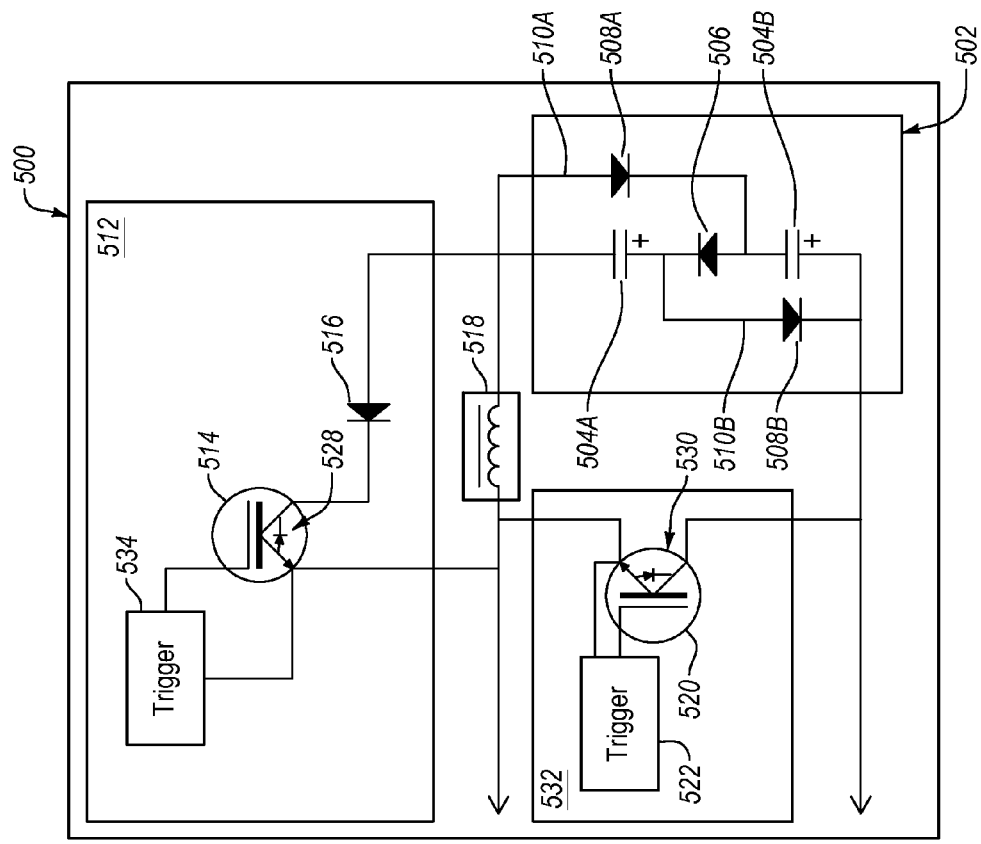
FIG. 6A is an example power supply system that may include the droop compensator of FIG. 5 that may be electrically coupled to an example modulator.
Figure 6A:
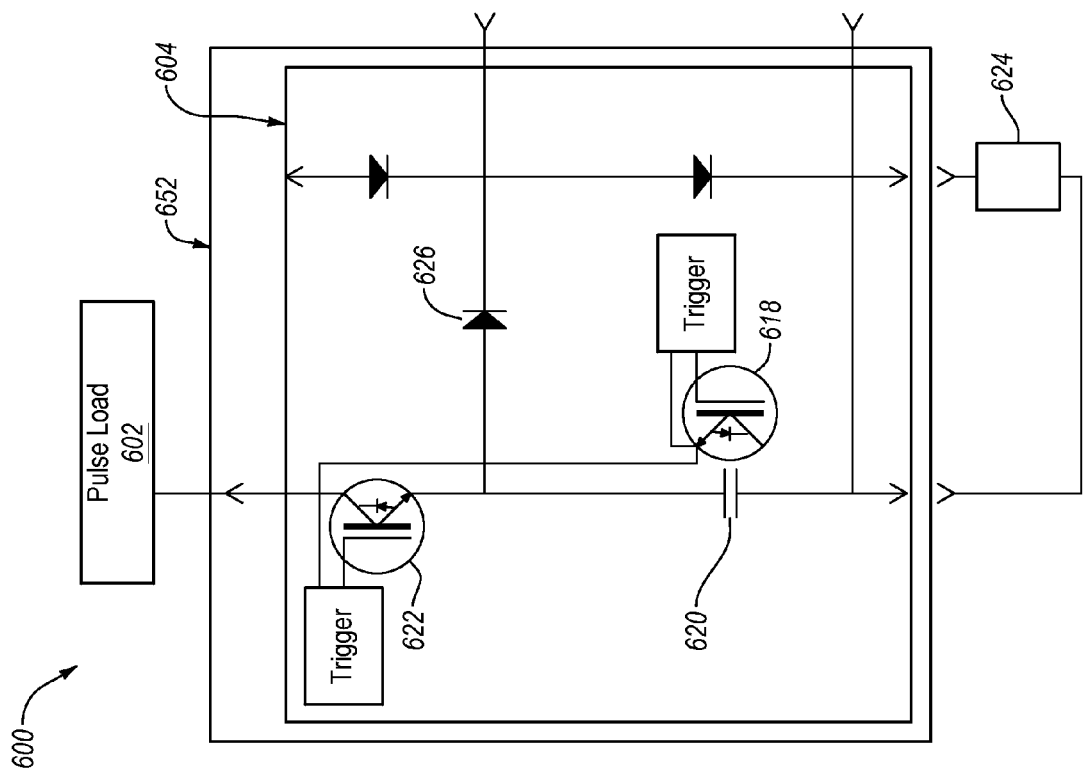
Figure 6B:
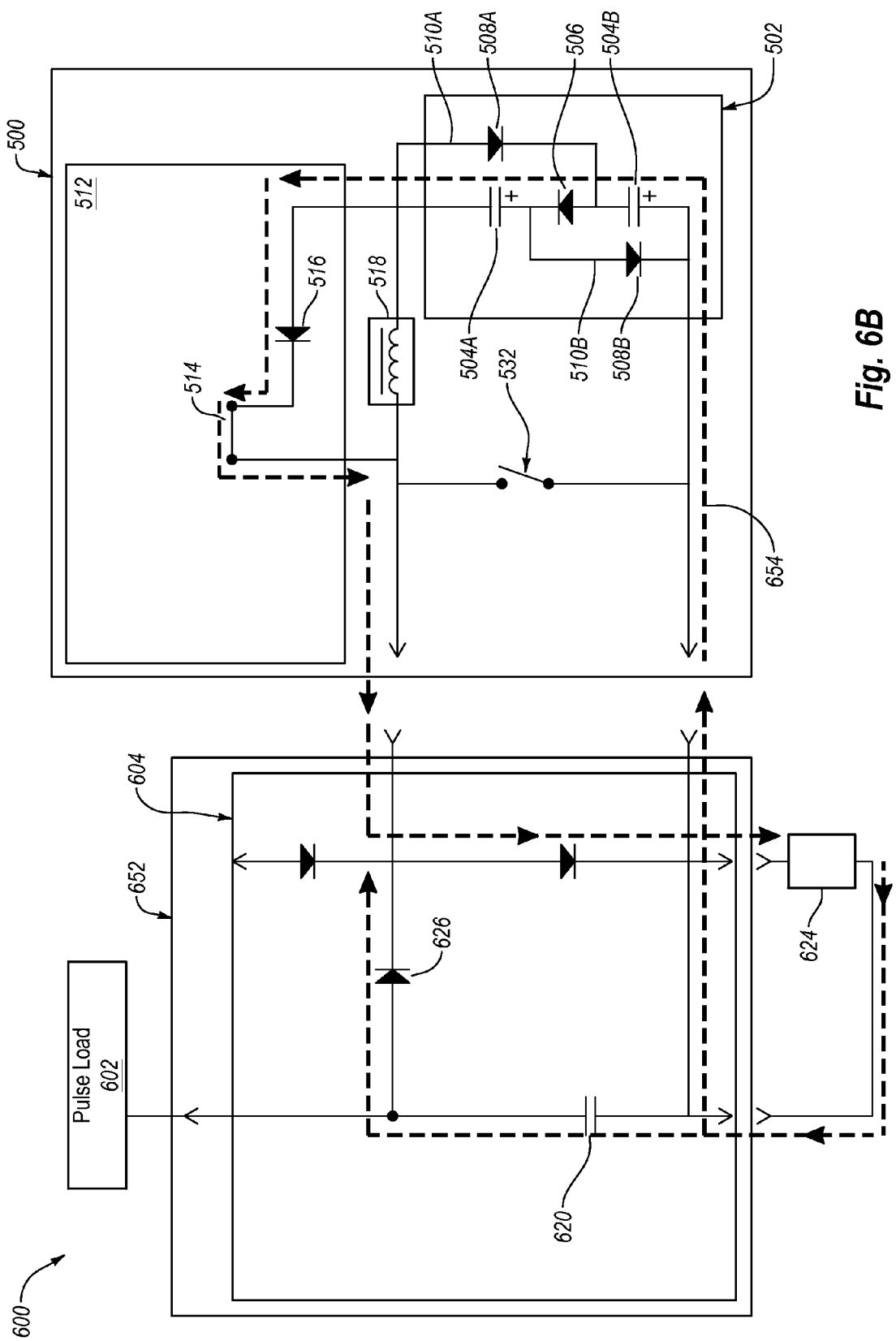
FIG. 6B is the power supply system of FIG. 6A performing an example operation of charging an example compensator supply.
Figure 6C:
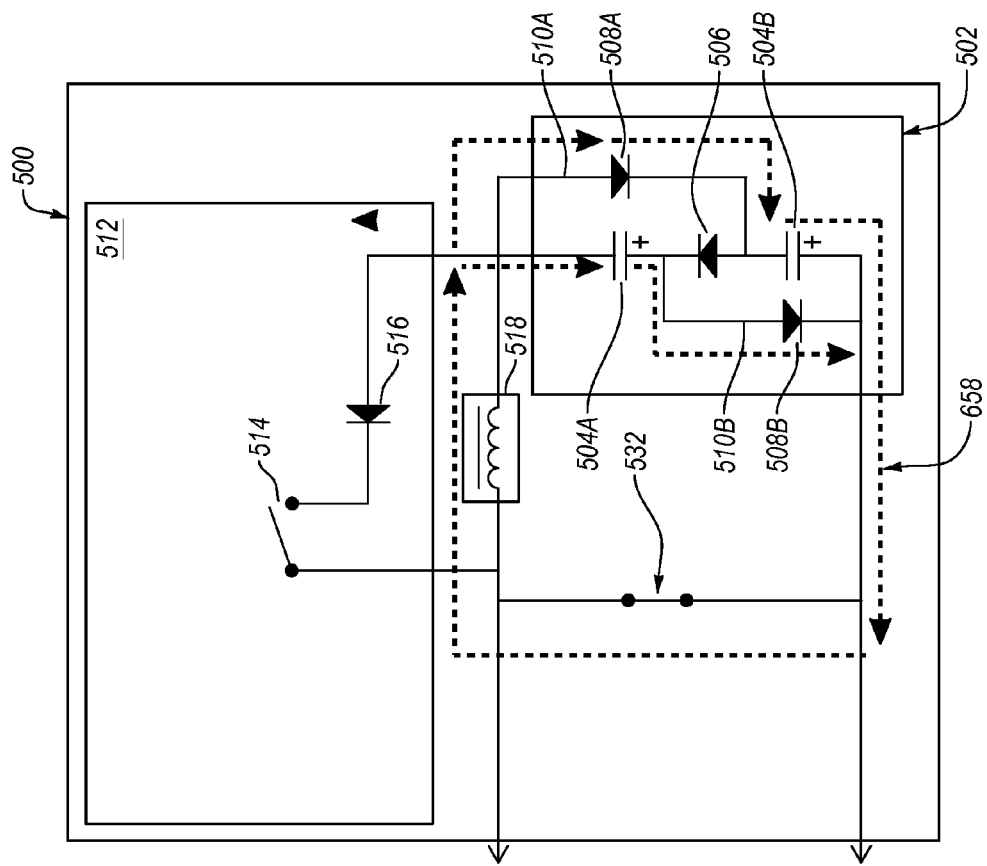
FIG. 6C is the power supply system of FIG. 6A performing an example operation of charging an example compensator inductor.
Figure 6C:
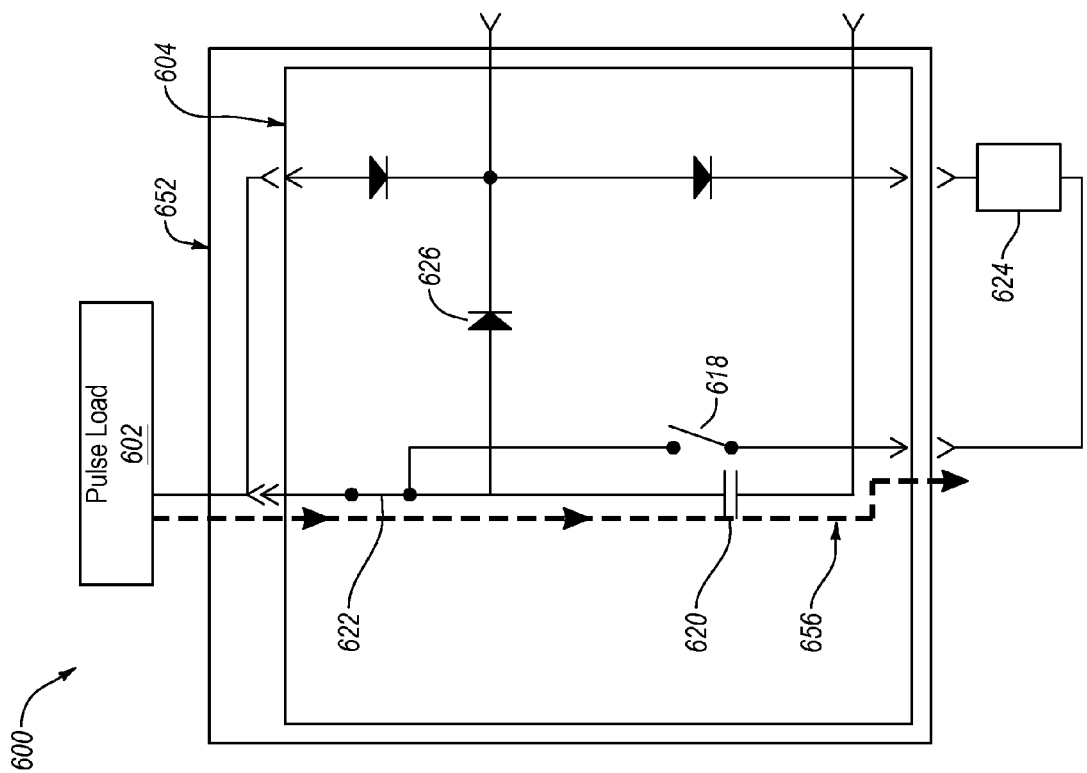
Figure 6D:
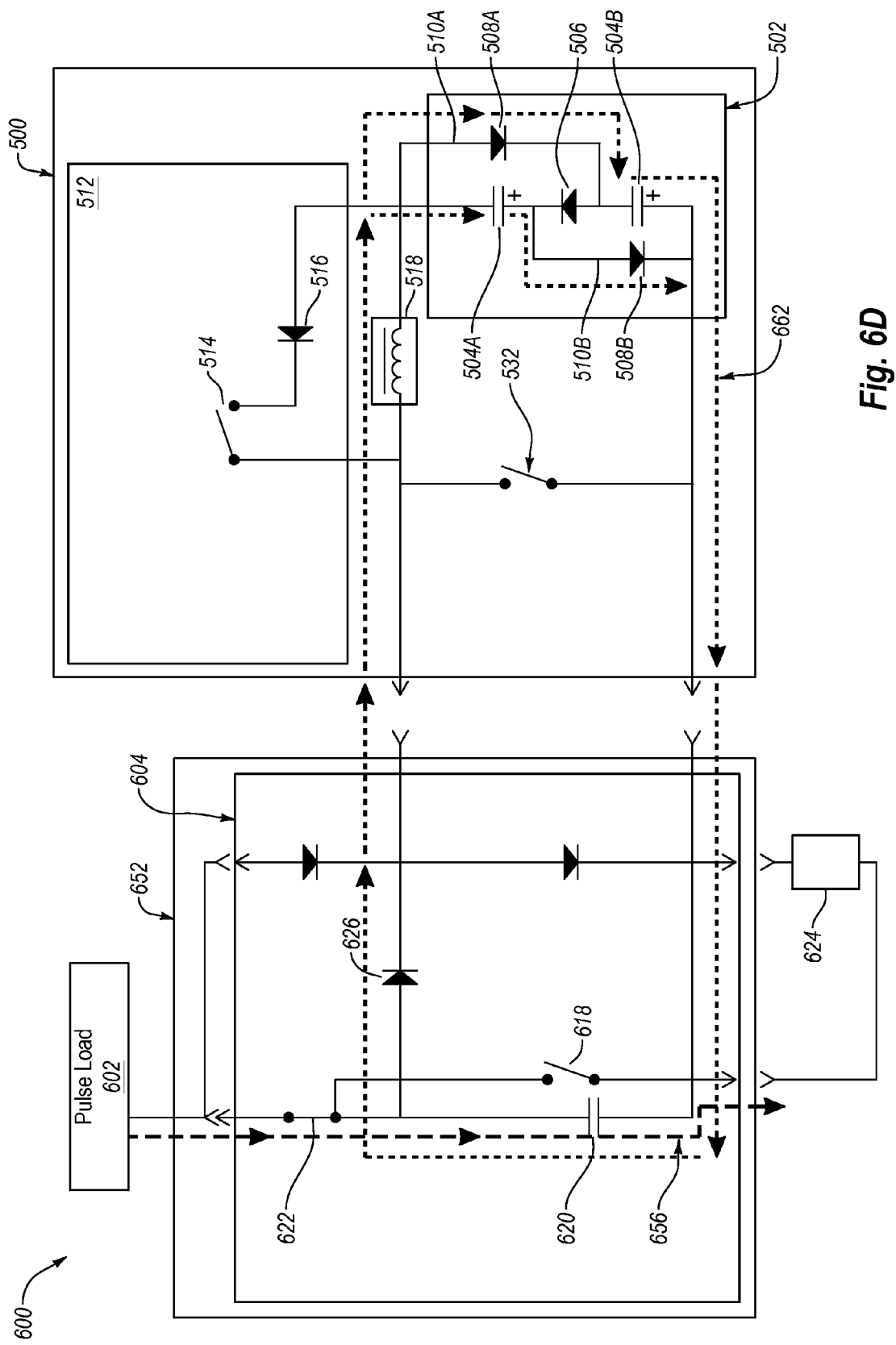
FIG. 6D is the power supply system of FIG. 6A performing an example operation of supplying the modulator with electrical energy from the compensator inductor and the compensator supply.

FIGS. 6A-6E illustrate an example power supply system 600. Specifically FIG. 6A illustrates an inclusive figure to introduce various components discussed with respect to FIGS. 6B-6D. FIGS. 6B-6D illustrate some operations that may be performed by the power supply system 600.

FIG. 6A illustrates an example power supply system 600. The power supply system 600 may include the droop compensator 500 described with respect to FIG. 5 that may be electrically coupled to a modulator 652. The modulator 652 may generate and supply a pulse to a pulse load 602. The modulator 652 is illustrated with one voltage cell 604; however, the modulator 652 may include multiple voltage cells 604 all of which may include similar components or functionality as the voltage cell 604. The voltage cell 604 may include a main capacitor 620, a main return switch 618, a main switch 622, and a main diode 626. The modulator 652 may be charged by a charging supply 624.

The modulator 652 may be electrically coupled to the droop compensator 500 discussed with respect to FIG. 5. The modulator 652 may be included as the boost converter load 526 that is omitted in FIGS. 6A-6E. Additionally, the charging supply 524 of FIG. 5 is numbered 624 in FIG. 6. These items may relate to a single component or apparatus.

Referring to FIGS. 6B-6E, the inductor-charging switch 532 and the inductor bypass switch 514 may control some operations of the droop compensator 500. Generally, the operations may include the inductor-charging switch 532 and the inductor bypass switch 514 cycling between an open position and a closed position. With each variation, the droop compensator 500 may perform an operation. The cycling between the open and the closed positions may be based upon a voltage on the main capacitor 620, an electrical current on the compensator inductor 518, or one or more time intervals, for instance.

Figure 6E:
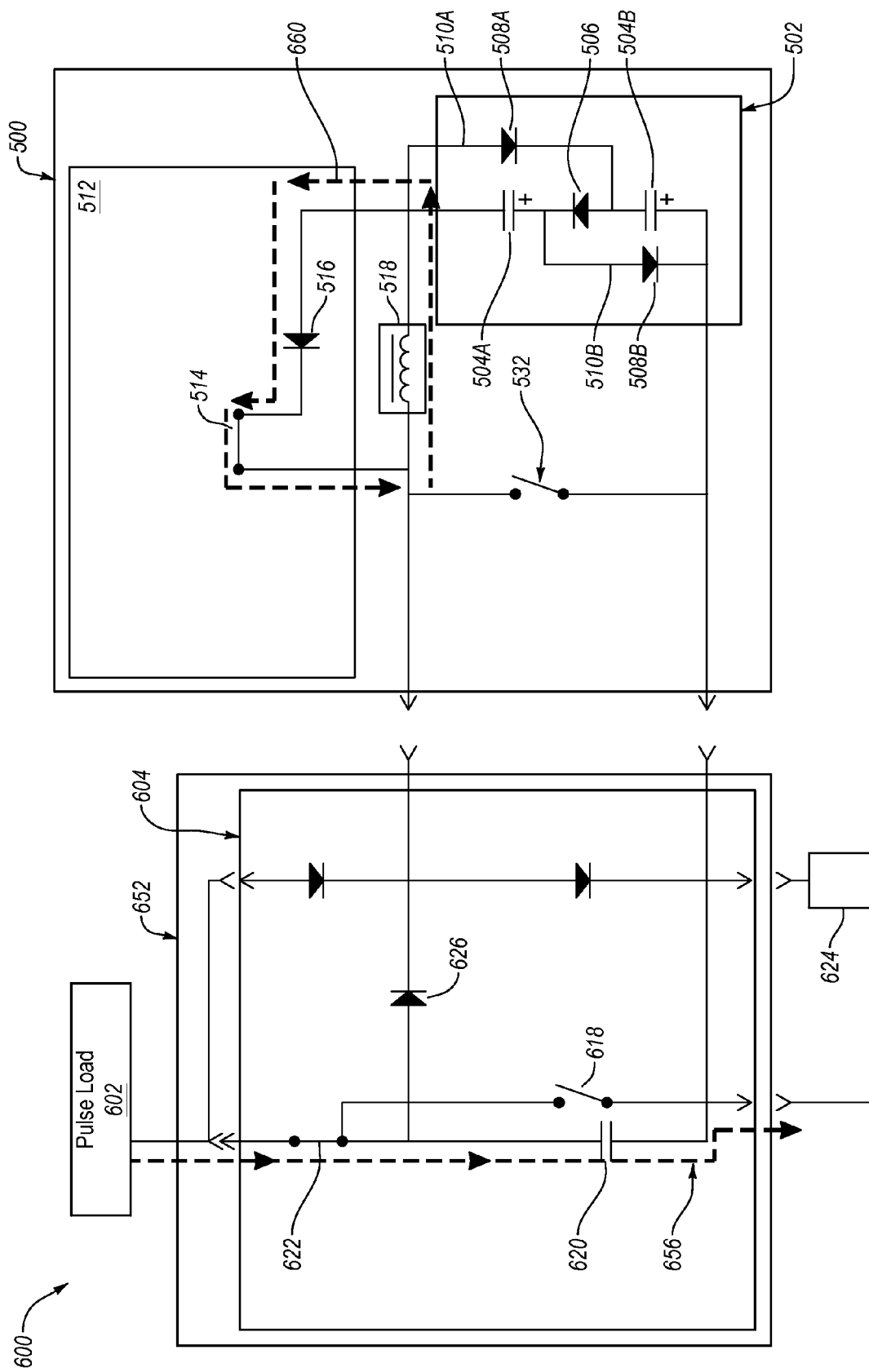
FIG. 6E is the power supply system of FIG. 6A performing an example operation of disconnecting the compensator inductor.

Some operations might include, but are not limited to: charging of the compensator supply 502 while bypassing the compensator inductor 518 which is illustrated in FIG. 6B; charging the compensator inductor 518 which is illustrated in FIG. 6C; supplying electrical energy from the compensator inductor 518 and the compensator supply 502 to the modulator 652 which is illustrate in FIG. 6D; and disconnecting the compensator inductor 518 which is illustrate in FIG. 6E.

FIG. 6B illustrates an example operation of charging the compensator supply 502. In FIG. 6B, various components of the modulator 652 and the voltage cell 604 are omitted for simplicity. Additionally, the inductor bypass switch 514, and the inductor-charging switch 532 are depicted as simple switches for simplicity.

Charging the compensator supply 502 may utilize circuit path 654 and may include connecting the charging supply 624 to the modulator 652. In the droop compensator 500, the inductor-charging switch 532 may be open and the inductor bypass switch 514 may be closed. In this and other configurations, the compensator inductor 518 may be bypassed. Thus, electrical energy supplied by the charging supply 624 may be introduced to the compensator supply 502. Once introduced to the compensator supply 502, the electrical energy may flow through the second energy storage capacitor 504B, the intra-energy storage capacitor diode 506, and the first energy storage capacitor 504A. The electrical energy may then flow into the inductor bypass 512. In the inductor bypass 512, the electrical energy may flow through the inductor bypass diode 516 and the inductor bypass switch 514. The electrical energy may then flow back to the modulator 652 and may complete a circuit with the charging supply 624.

In some embodiments, the compensator supply 502 may also charge the main capacitor 620. Specifically, the electrical energy may flow from the charging supply 624 through the main capacitor 620 then through the main diode 626 and complete a circuit with the charging supply 624. In FIGS. 6B-6E, the charging supply 624 remains coupled to the modulator 652. However, this depiction is not meant to be limiting. In some embodiments, when the main capacitor 620 and the compensator supply 502 are charged, the charging supply 624 may be disconnected from the modulator 652 and the droop compensator 500.

Referring next to FIG. 6C, an example operation of charging the compensator inductor 518 is illustrated. In FIG. 6C, various components of the modulator 652 and the voltage cell 604 are omitted for simplicity. Additionally, the inductor bypass switch 514, the main switch 622, the main return switch 618, and the inductor-charging switch 532 are depicted as simple switches for simplicity.

When the main capacitor 620 is charged, the modulator 652 may begin to supply a pulse to the pulse load 602 as depicted by a current path 656. While supplying the pulse, the main switch 622 may be closed and the main return switch 618 may be open. In this and other configurations, the main capacitor 620 of the voltage cell 604 may be connected in series with other voltage cells with similar configurations to the voltage cell 604 to supply pulses to the pulse load 602. By configuring the voltage cells in series, the voltage of the pulses supplied to the pulse load may be increased.

Additionally, after the main capacitor 620 and the compensator supply 502 are charged, the compensator inductor 518 may be charged via a circuit path 658. To charge the compensator inductor 518, the inductor bypass switch 514 may be opened and the inductor-charging switch 532 may be closed. In this and other configurations, the electrical potential stored in the compensator supply 502 may discharge or be diverted to the compensator inductor 518 such that an electrical energy flows through the compensator inductor 518.

Specifically, the electrical energy may be discharged from the first energy storage capacitor 504A and may flow through the second energy storage bypass diode 508B. The electrical energy originating at the first energy storage capacitor 504A may then flow through the inductor-charging switch 532. After the electrical energy originating at the first energy storage capacitor 504A flows through the inductor-charging switch 532, the electrical energy originating at the first energy storage capacitor 504A may flow through the compensator inductor 518 and back to the first energy storage capacitor 504A.

Additionally, the electrical energy may be discharged from the second energy storage capacitor 504B. The electrical energy originating at the second energy storage capacitor 504B may then flow through the inductor-charging switch 532, then to through the compensator inductor 518. The electrical energy originating at the second energy storage capacitor 504B may then flow through the first energy bypass diode 508A, then back to the second energy storage capacitor 504B.

The inductor bypass switch 514 may remain open thereby allowing the electrical energy to flow through the compensator inductor 518 until an electrical current on the compensator inductor 518 reaches a predetermined current charge value and/or for a predetermined charge time interval. Charging of the compensator inductor 518 may occur when the electrical current in the compensator inductor 518 is less than a predetermined inductor current value and/or after a predetermined time interval, for instance.

Generally, the predetermined current charge value, the predetermined inductor current value, the predetermined charge time interval, and/or the predetermined time interval may be related. For example, in some embodiments the predetermined current charge value may be equal to the predetermined inductor current value. Additionally or alternatively, the predetermined charge time interval and the predetermined time interval may be equal.

FIG. 6D illustrates an example operation of supplying the modulator 652 with electrical energy from the compensator inductor 518 and the compensator supply 502. Generally, the operation of supplying the modulator 652 with electrical energy is controlled by changing the state of the inductor-charging switch 532. The inductor charging switch 532 being in an open state may allow electrical energy to be supplied to the modulator 652. The inductor charging switch 532 being in a closed state may not allow electrical energy to be supplied to the modulator 652.

In FIG. 6D, various components of the modulator 652 and the voltage cell 604 are omitted for simplicity. Additionally, the inductor bypass switch 514, the main switch 622, the main return switch 618, and the inductor-charging switch 532 are depicted as simple switches for simplicity.

To supply the modulator 652 with electrical energy, the inductor-charging switch 532 may open and the inductor bypass switch 514 may open. This may occur when an electrical current of the compensator inductor 518 increases to a predetermined electrical current, a predetermined time interval occurs, when a voltage on the main capacitor 620 drops below a predetermined voltage value, or some combination thereof. In this and other configurations, the electrical energy stored in the compensator inductor 518 and the compensator supply 502 may be supplied to the main capacitor 620 of the modulator 652 via a circuit path 662.

Specifically, when the compensator supply 502 and the compensator inductor 518 supply the electrical energy to the modulator 652, the electrical energy may flow from the compensator inductor 518, the first energy storage capacitor 504A, and the second energy storage capacitor 504B. From the compensator inductor 518 the electrical energy flows through the compensator supply 502 then to the modulator 652. The electrical energy charges the main capacitor 620 and completes the circuit path 662 through the main diode 626. The electrical energy from the first energy storage capacitor 504A flows through the second storage bypass diode 508B and to the modulator 652. The electrical energy from the first energy storage capacitor 504A charges the main capacitor 620. The circuit path 662 includes the main diode 626 and the compensator inductor 518 and is completed at the first energy storage capacitor 504A. Likewise, the electrical energy from the second energy storage capacitor 504B flows to the modulator 652 to charge the main capacitor 620. The electrical energy from the second storage capacitor 504B then flows through the main diode 626, the compensator inductor 518, and the first energy storage bypass diode 508A to complete the circuit path 662 at the second energy storage capacitor 504B.

In some embodiments, rather than the intra-energy storage capacitor diode 506, the compensator supply 502 may include a peaking switch. The peaking switch may include an IGBT. The peaking switch may act as a diode or a switch. Thus, in embodiments including the IGBT, the circuit path 626 may place the first energy storage capacitor 504A and the second energy storage capacitor 504B in series to supply the modulator 652. By placing the first energy storage capacitor 504A and the second energy storage capacitor 504B in series may allow for in an increased voltage to be supplied to the modulator 652, and in particular the main capacitor 620. The supplied electrical energy may charge the main capacitor 620 electrically coupled to the droop compensator 500. The inductor-charging switch 532 may remain open and the inductor bypass switch 514 may remain open until the main capacitor 620 is charged to a predetermined voltage value or for a predetermined time interval.

FIG. 6E illustrates an example operation of disconnecting the compensator inductor 518 when a voltage on the main capacitor 620 exceeds a predetermined voltage. For example, when the main capacitor 620 exceeds a predetermined operation voltage used for generating a pulse, the compensator inductor 518 may be disconnected from the modulator 652 so that additional energy is not supplied to the modulator 652 from the compensator inductor 518.

In FIG. 6E, various components of the modulator 652 and the voltage cell 604 are omitted for simplicity. Additionally, the inductor bypass switch 514, the main switch 622, the main return switch 618, and the inductor-charging switch 532 are depicted as simple switches for simplicity.

As an example of operation of the circuit illustrated in FIG. 6E, when a voltage on the main capacitor 620 exceeds a predetermined voltage, the inductor-charging switch 532 may open and the inductor bypass switch 514 may close. The electrical energy of the compensator inductor 518 flows through the inductor bypass diode 516 and the inductor bypass switch 514 a represented in a circuit path 660. The compensator inductor 518 may dissipate electrical energy through the circuit path 660.

In this and other configurations, the electrical potential stored in the compensator supply 502 may not be supplied to the modulator 652. Instead, a reverse voltage across the main diode 626 may prevent the discharge of the electrical potential stored in the compensator supply 502. When the charge on the main capacitor 620 decreases, the inductor bypass may open, transitioning to the configuration depicted in FIG. 6D. Alternatively, when the electrical energy of the compensator inductor 518 drops below a predetermined threshold the inductor-charging switch may close, transitioning to the configuration depicted in FIG. 6C. The above-described operations may occur in the sequence described or in any sequence as determined by the power supply system 600 configurations and the components included therein.

Figure 7:
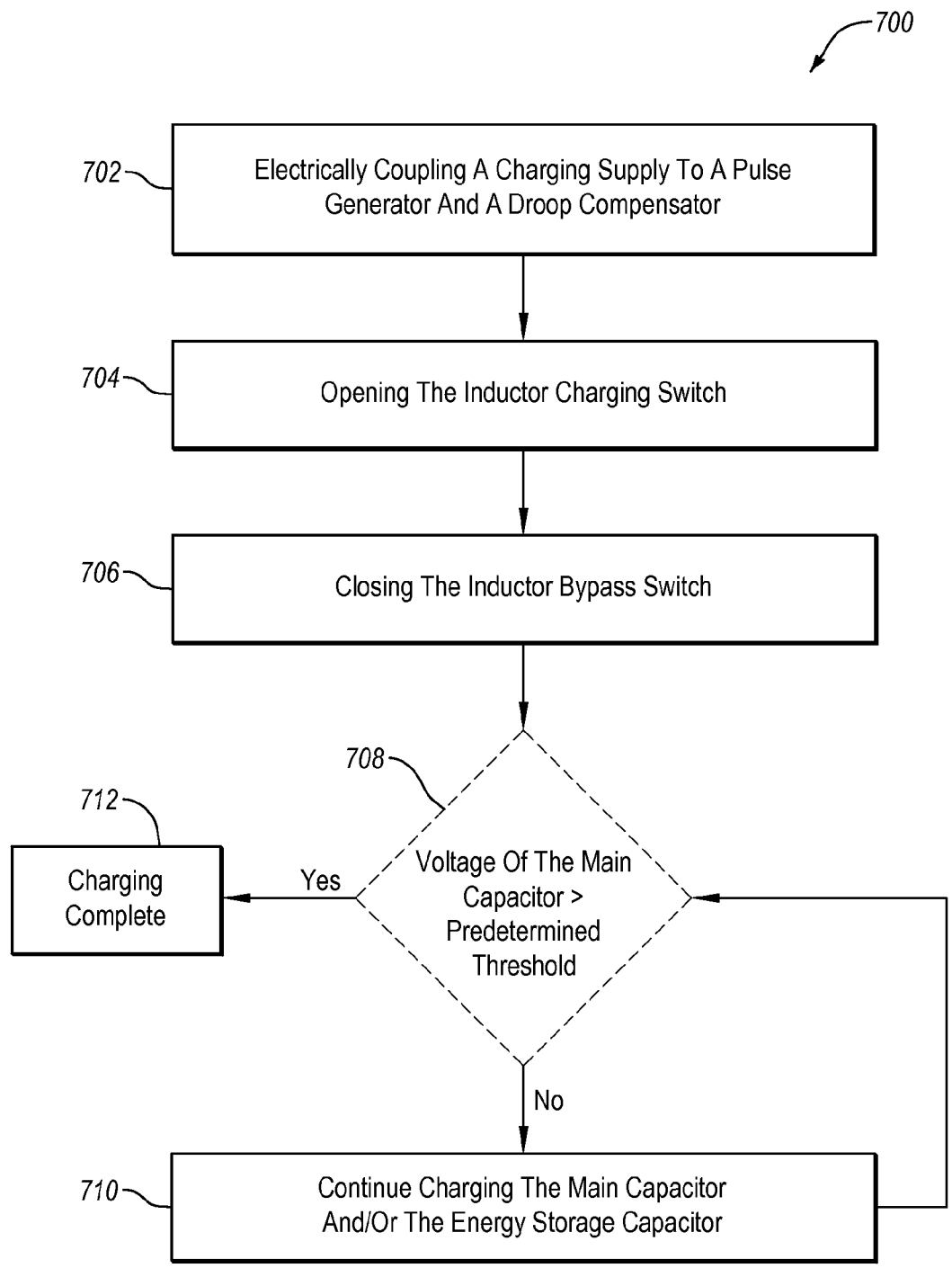
FIG. 7 is a flow chart of an example method 700 of charging a droop compensation system that may be performed by the power supply system of FIG. 1.

FIG. 7 is a flow chart of an example method 700 of charging a droop compensation system. The method 700 may be performed, for example, by the power supply system 100 described with respect with FIG. 1. The flow charts described herein do not necessarily imply a fixed order to the actions, and embodiments may be performed in any order that is practicable. Additionally or alternatively, in some embodiments, one or more of the actions may be omitted, additional actions may be included, or alternative actions may be included without limitation.

Additionally, the methods described herein may be performed by hardware, software (including microcode), or a combination of hardware and software. For example, a storage medium may store thereon instructions that when executed by a machine result in performance according to any of the embodiments described herein.

The method 700 may begin at 702 by charging supply may be electrically coupled to a pulse generator and/or a droop compensator. The droop compensator may include a compensator supply. The charging supply may charge one or more main capacitors included in voltage cells of the pulse generator and/or one or more energy storage capacitors included in a boost converter of the droop compensator. The electrical coupling may allow the main capacitor(s) and the energy storage capacitor(s) to charge in parallel. In some embodiments, the compensator supply may include two or more energy storage capacitors. The two or more energy storage capacitors may be configured in series.

At 704, an inductor-charging switch may be opened. The inductor-charging switch may be included in the droop compensator. At 706, the inductor bypass switch is closed. The inductor bypass switch may be included in the droop compensator.

With the inductor-charging switch in an open position and the inductor bypass switch in a closed position a circuit may be created. The circuit may direct electrical energy introduced by the charging supply to the energy storage capacitor and/or the main capacitor. The energy storage capacitor and/or the main capacitor may charge.

At 708, the system may determine whether a voltage of the main capacitor is greater than a predetermined threshold. If the voltage of the main capacitor is greater than, or equal to, a predetermined threshold, the method 700 may proceed to 712. At 712, the method 700 may be complete.

Alternatively, the method 700 may proceed to 710. At 710, the charging supply may continue to charge the main capacitor and/or the energy storage capacitor. The system may continue to charge the main capacitors and/or the energy storage capacitor until the predetermined threshold is reached.

Figure 8:
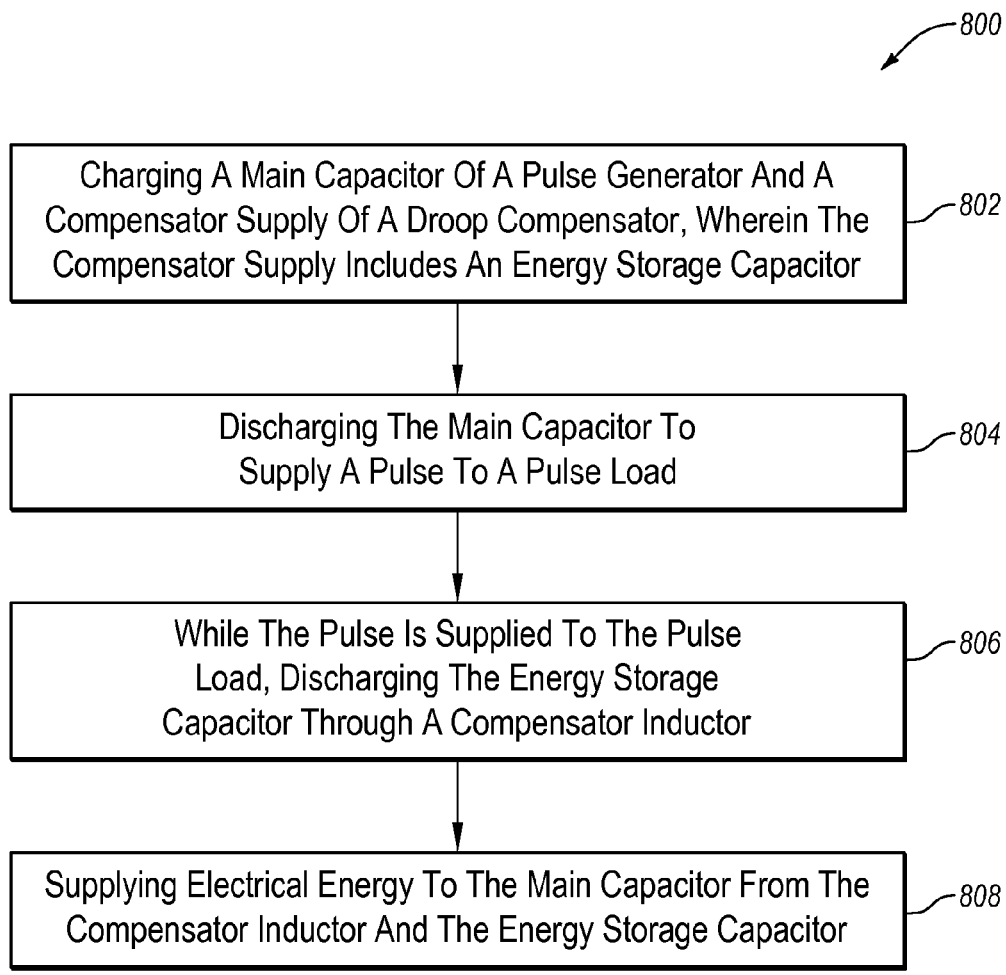
FIG. 8 is a flow chart of an example method 800 of droop compensation for voltage pulse generators that may be performed by the power supply system of FIG. 1.

FIG. 8 is a flow chart of an example method 800 of droop compensation for voltage pulse generators. In some embodiments, the method 800 may be performed by the power supply system 100 of FIG. 1.

The method 800 may begin at 802 by charging a main capacitor of a pulse generator and a compensator supply of a droop compensator. The compensator supply may include one or more energy storage capacitors. In some embodiments, the charging may include closing an inductor bypass switch such that while charging the compensator supply, a compensator inductor is bypassed. Additionally or alternatively, in some embodiments, the charging may include opening an inductor-charging switch such that electrical energy may flow back to the pulse generator and complete a circuit with the charging supply. Additionally or alternatively, the charging may include one or more of the actions of method 700 describe above.

At 804, the method 800 may include discharging the main capacitor to supply a pulse to a pulse load. The pulse load may include a klystron, a magnetron, a spectrometer, an accelerator, a radar transmitter, a high-impedance electron gun, an ion tube, a liquid polarizing cell, a spark gap, and/or a thyratron, for example.

At 806, the method 800 may include discharging the energy storage capacitor through a compensator inductor while the pulse is supplied to the pulse load. In some embodiments, discharging the energy storage capacitor includes closing an inductor-charging switch and opening the inductor bypass switch such that electrical energy flows through the compensator inductor. By discharging the energy storage capacitor through the compensator inductor, electrical energy may be stored on the compensator inductor. Additionally in some embodiments, discharging the energy storage capacitor through a compensator inductor may occur when an inductor current on the compensator inductor is less than a predetermined value.

At 808, the method 800 may include supplying electrical energy to the main capacitor from the compensator inductor and the energy storage capacitor. In some embodiments, supplying electrical energy may include opening the inductor-charging switch. By opening the inductor-charging switch, a circuit may be created in which electrical energy stored in the compensator inductor and the energy storage capacitor may be supplied to the main capacitor of the pulse generator. By supplying electrical energy to the main capacitor, the droop of the main capacitor may be reduced. Supplying electrical energy to the main capacitor from the compensator inductor and the energy storage capacitor may continually or periodically occur to maintain the voltage on the main capacitor.

Alternatively, the compensator inductor may be disconnected until the charge on the main capacitor drops below a predetermined voltage. For example, while the main capacitor is adequately charged the compensator inductor may be disconnected from the main capacitor. While the compensator inductor is disconnected, the compensator supply may be isolated from the main capacitor by a main diode.

In some embodiments, the system may determine whether a voltage of the main capacitor is less than a predetermined threshold. If the voltage of the main capacitor is less than the predetermined threshold, the method 800 may supply electrical energy to the main capacitor from the compensator inductor and/or the energy storage capacitor. If however, the voltage of the main capacitor is greater than, or equal to, the predetermined threshold, the method 800 may disconnect the compensator inductor.

The present invention may be embodied in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A pulse voltage power supply system comprising:
a main capacitor used to generate an electrical pulse;
a boost converter coupled with the main capacitor, wherein the boost converter comprises:
   a droop compensator including an energy storage capacitor that stores electrical energy; and
   a compensator inductor;
   an inductor bypass switch that operably controls flow of electrical energy through an inductor bypass; and
   an automatic triggering system configured to close the inductor bypass switch when a voltage on the main capacitor equals or exceeds a predetermined threshold such that the voltage on the main capacitor is maintained.

2. The pulse voltage power supply system of claim 1, wherein
the inductor-charging switch operably controls electrical energy discharged by the energy storage capacitor through the compensator inductor.

3. The pulse voltage power supply system of claim 2, wherein during the pulse:
the inductor-charging switch and the inductor bypass switch cycle open and closed based upon a voltage on the main capacitor.

4. The pulse voltage power supply system of claim 1, further comprising:
a charging supply configured to charge the energy storage capacitor and the main capacitor in parallel.

5. The pulse voltage power supply system of claim 2, wherein:
when the charging supply is charging the energy storage capacitor, the inductor bypass switch is closed such that the compensator inductor is bypassed.

6. The pulse voltage power supply system of claim 1, wherein:
the pulse generator is a single capacitor modulator that may supply a pulse load with a pulse having a positive voltage.

7. The pulse voltage power supply system of claim 1, wherein:
the pulse generator is a single capacitor modulator that may supply a pulse load with a pulse having a negative voltage.

8. The pulse voltage power supply system of claim 1, wherein:
the main capacitor supplies the pulse to a klystron or a magnetron.

9. The pulse voltage power supply system of claim 1, wherein:
the electrical pulse is between about 100 microseconds and about 50 milliseconds in duration.

10. A droop compensator comprising:
a boost converter including:
   a compensator inductor,
   a compensator supply, wherein the compensator supply comprises
      two energy storage capacitors with positive and negative terminals;
      an intra-energy storage capacitor diode between the negative terminal of one of the two energy storage capacitors and the positive terminal of another of the two energy storage capacitors;
      a first energy storage bypass diode in parallel with one of the two energy storage capacitors; and
      a second energy storage bypass diode in parallel with another of the two energy storage capacitors, and
   an inductor-charging switch electrically coupled with the compensator inductor and the compensator supply that controls the charging of the compensator inductor and the supply of electrical energy to a main capacitor of a pulse generator; and
a pulse generator connector configured to allow the boost converter to be electrically coupled with the main capacitor of the pulse generator.

11. The droop compensator of claim 10, wherein:
the two energy storage capacitors charges in parallel with the main capacitor when electrically coupled to a charging supply, wherein the two energy storage capacitors within the compensator supply are charge in a series configuration.

12. The droop compensator of claim 10, wherein each of the two energy storage capacitors are of comparable size to the main capacitor.

13. The droop compensator of claim 10, wherein the compensator supply includes:
a peaking switch between the negative terminal of one of the two energy storage capacitors and the positive terminal of another of the two energy storage capacitors.

14. The droop compensator of claim 10, further comprising:
an inductor bypass configured in parallel to the compensator inductor including:
   an inductor bypass switch; and
   an inductor bypass diode configured in series with the inductor bypass switch,
   wherein, when the inductor bypass switch is closed, electrical energy can flow through the inductor bypass diode and the inductor bypass switch thereby preventing the electrical energy in the compensator inductor from entering the main capacitor.

15. The droop compensator of claim 14, wherein:
when a voltage on the main capacitor is greater than or equal to than a predetermined threshold,
   the inductor-charging switch opens, and
   the inductor bypass switch closes diverting electrical energy from the compensator inductor and the supply;
when the voltage on main capacitor is less than the predetermined threshold,
   the inductor bypass switch opens coupling the compensator inductor to the main capacitor;
when an inductor current in the compensator inductor is less than a second predetermined threshold,
   the inductor bypass switch opens and the inductor bypass switch remains open until the inductor current in the compensator inductor reaches the second predetermined threshold, and the inductor-charging switch closes diverting electrical potential from the supply through the compensator inductor; and when the inductor current is greater than or equal to the second predetermined threshold,
the inductor-charging switch opens, and
the inductor bypass switch opens supplying the electrical energy in the compensator inductor and the supply to the main capacitor.

16. The droop compensator of claim 15, further comprising an inductor-charging switch trigger and an inductor bypass switch trigger.

17. The droop compensator of claim 15, wherein the inductor-charging switch and the inductor bypass switch are MOSFETs, IGBTs, or FETs.

18. The droop compensator of claim 15, wherein
operation of the inductor-charging switch by the inductor-charging switch trigger and the inductor bypass switch by the inductor bypass switch trigger automatically occurs when:
the voltage on the main capacitor is greater than or equal to a predetermined threshold;
the voltage on main capacitor is less than the predetermined threshold;
the inductor current in the compensator inductor is less than a second predetermined threshold; and
the inductor current is greater than or equal to than the second predetermined threshold.

19. A method of droop compensation for voltage pulse generators comprising:
charging a main capacitor of a pulse generator and a supply of a droop compensator, wherein the supply includes an energy storage capacitor;
discharging the main capacitor to supply a pulse to a pulse load;
while the pulse is supplied to the pulse load, discharging the energy storage capacitor through a compensator inductor; and
supplying electrical energy to the main capacitor from the compensator inductor and the energy storage capacitor;
wherein when an inductor current on the compensator inductor is less than a predetermined value, opening an inductor bypass switch;
closing an inductor-charging switch; and
allowing the energy storage capacitor to discharge to the compensator inductor.

20. The method of droop compensation of claim 19, wherein:
discharging the energy storage capacitor includes closing an inductor-charging switch; and
supplying electrical energy to the main capacitor from the compensator inductor includes opening the inductor-charging switch.

21. The method of droop compensation of claim 20, wherein:
charging the main capacitor and the supply further includes:
closing an inductor-charging switch such that while charging the supply, the compensator inductor is bypassed, and
opening the inductor-charging switch such that electrical energy may flow back to the pulse generator and complete a circuit with the charging supply.

22. The method of droop compensation of claim 21, further comprising
when a voltage on main capacitor equals or exceeds a predetermined threshold, closing the inductor bypass switch, and
maintaining the voltage on the main capacitor.

* * * * *